United States Patent [19]

Economu et al.

[11] Patent Number: 5,026,574
[45] Date of Patent: Jun. 25, 1991

[54] CHEMICAL VAPOR DEPOSITION PROCESS FOR DEPOSITING LARGE-GRAIN POLYSILICON FILMS

[75] Inventors: Nikolaos A. Economu, Thessaloniki, Greece; Douglas B. Meakin, Harrow-on-the-Hill, England

[73] Assignee: The General Electric Company, p.l.c., England

[21] Appl. No.: 302,543

[22] Filed: Jan. 25, 1989

Related U.S. Application Data

[63] Continuation of Ser. No. 26,144, Mar. 16, 1987, abandoned.

[30] Foreign Application Priority Data

Mar. 19, 1986 [GB] United Kingdom ............... 8606784

[51] Int. Cl.$^5$ .................. C23C 16/00; H01L 21/469
[52] U.S. Cl. .............................. 427/248.1; 427/255; 437/233
[58] Field of Search ............... 427/248.1, 38, 255; 437/233

[56] References Cited

U.S. PATENT DOCUMENTS

| | | | |
|---|---|---|---|
| 3,112,997 | 12/1963 | Benzing et al. | 427/248.1 |
| 3,900,597 | 8/1975 | Chruma et al. | 427/255 |
| 4,001,762 | 1/1977 | Aoki et al. | 427/93 |
| 4,113,551 | 9/1978 | Bassous et al. | 156/662 |
| 4,129,463 | 12/1978 | Cleland et al. | 437/2 |
| 4,351,856 | 9/1982 | Matsui et al. | 427/38 |
| 4,363,828 | 12/1982 | Brodsky et al. | 427/39 |
| 4,443,488 | 3/1984 | Little et al. | 427/38 |

OTHER PUBLICATIONS

"Thin Film Process", Ed. Vossen et al., pp. 274–278, Academic Press, N.Y., 1978.
"Chemical Vapor Depositon", by Blocker, *Deposition Technologies for Film and Coatings*, Noyes Publication, 1982, pp. 335–364.
Cauer et al., "Chemical Vapor Deposition Polycrystallin Si", *J. Elecrochem Soc.*; Solid State Science & Tech., pp. 1565–1570, vol. #119, #11, date unknown (Nov.).
Zolinger et al., "Growth Conditions & Properties of Evaporated Semicrystalline Si Layers", *Thin Solid Films*, 58, #1 (15 Mar. 1979), pp. 89–93.

Primary Examiner—Norman Morgenstern
Assistant Examiner—Marianne L. Padgett
Attorney, Agent, or Firm—Kirschstein, Ottinger, Israel & Schiffmiller

[57] ABSTRACT

A deposition process includes the steps of heating a substrate, and passing silane gas over the substrate such that the heated substrate causes decomposition of the silane gas thereby to cause deposition of polysilicon film on the substrate. The temperature of the substrate and the pressure of the silane gas are controlled so as to increase the grain size of the deposited films.

7 Claims, 1 Drawing Sheet

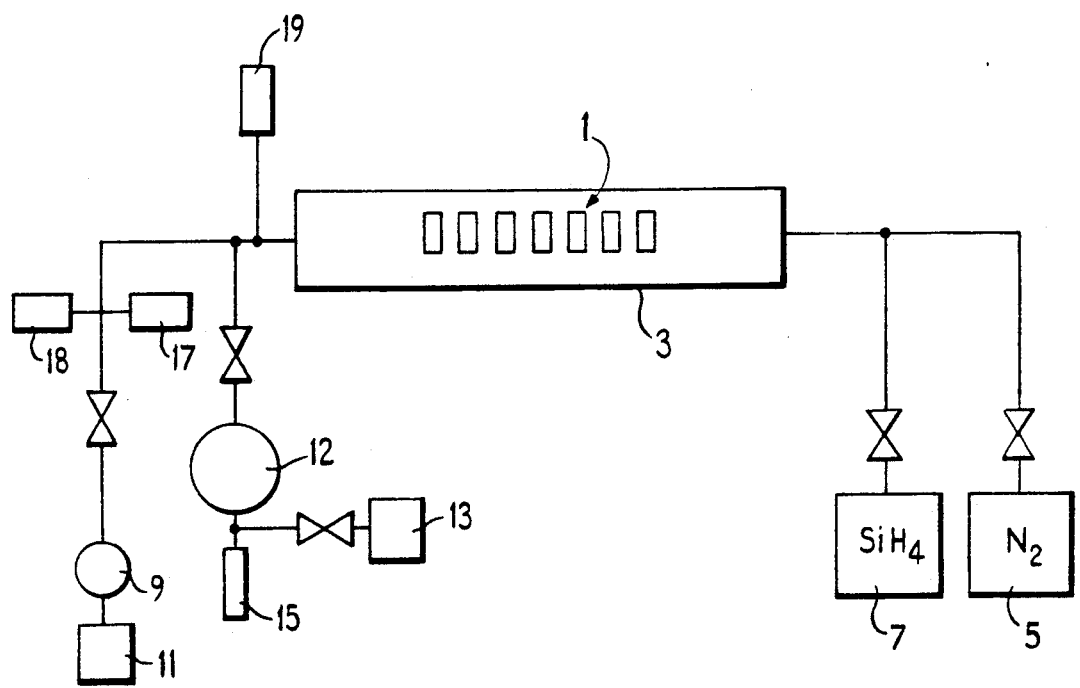

CHEMICAL VAPOR DEPOSITION PROCESS FOR DEPOSITING LARGE-GRAIN POLYSILICON FILMS

This is a continuation, of application Ser. No. 07/026,144 filed Mar. 16, 1987 now abandoned.

BACKGROUND OF THE INVENTION

1. Field of the Invention

This invention relates to deposition processes. In particular the invention relates to deposition processes for depositing polysilicon from silane gas using low pressure chemical vapour deposition techniques.

2. Description of Related Art

Low pressure chemical vapour deposition of polysilicon from silane is an industry-standard technique. In this technique silane gas is passed through a hot walled deposition vessel containing the substrates on which it is required to deposit the polysilicon, such that the reaction of the silane with the heated substrates causes decomposition of the silane such that respective polysilicon films are deposited on the substrates. Typical process parameters using the technique are a deposition vessel temperature of 630° C., and a silane gas flow of between 20 to 60 standard ccs per minute through the vessel, the vessel being held at a pressure of between 10 and 30 Pascals using a rotary or rotary and Root pump system pumping at between 50 to 300 liters per minute.

The grain structure of the polysilicon films produced by such a process is invariably microcrystalline, with a grain size of around 200Å.

Such films are not statisfactory for some thin film electronic devices, for example transistors, as grain boundary effects dominate and degrade the performance of the devices. Whilst it is possible to obtain larger grain sizes by increasing the temperature of the substrate this is not possible where, for example, the substrates are made of glass. The use of such glass substrates is becoming of increasing industrial importance for example in matrix addressed large panel displays in which the transistors form switching elements.

SUMMARY OF THE INVENTION

It is an object of the present invention to provide a deposition process for depositing polysilicon using low pressure chemical vapour deposition techniques wherein the grain size of the deposited polysilicon is increased.

According to the present invention a deposition process comprises: heating a substrate and passing silane gas over the substrate such that the heated substrate causes decomposition of the silane gas thereby to cause deposition of a polysilicon film on the substrate, the process being characterised in that the temperature of the substrate and the pressure of the silane gas are controlled so as to increase the grain size of the deposited films.

The pressure of the silane gas is suitably maintained at less than 1 Pascal.

BRIEF DESCRIPTION OF THE DRAWING

One deposition process in accordance with the invention will now be described, by way of example only, with reference to the accompanying sole FIGURE which is a schematic diagram of the chemical vapour deposition apparatus used in the process.

DETAILED DESCRIPTION OF THE PREFERRED EMBODIMEMT

Referring to the drawing, the apparatus includes a furnace tube 1 in which are placed a stack of closely spaced silicon wafer 3 arranged within the tube so as to enable the high throughout of gases through the tube. The tube has a gas inlet to which are connected sources of $N_2$ 5 and $SiH_4$ 7 via a gas manifold and an appropriate valve system. The tube also has a gas outlet to which is connected a pumping system comprising a Roots pump 9 baacked by a rotary pump 11 and a Turbo pump 12 also backed by a rotary pump 13. Two Pirani gauges 15, 17, a capacitance manometer 18 and a Penning gauge 19 are provided in order to monitor the pressures in the system, an appropriate valve system being provided to control the system.

In use of the apparatus the tube 1 is heated to about 630° C., and pumped out to a pressure of less than 0.1 Pascal i.e. 0.8 m Torr using initially the Roots pump and subsequently the Turbo pump. The $S1H_4$ is bled through the tube 1 at a rate of 1.0 cc per minute the pumping system pumping at a rate of 990 to 2300 liters per minte, i.e. 350 to 800 cubic feet per minute, to maintain pressure in the tube 1 of between 0.25 and 1 Pascal. i.e. between 2.5 and 10 m Torr.

After the deposition process has taken place, $N_2$ from the source 7 is used to vent the system.

It is found that the polysilicon films deposited on the substrates using the process described herebefore corresponding to silane pressures of 1 Pascal have grain sizes of 4000Å whilst those corresponding to silane pressure of 0.25 Pascal have grain sizes of 10000Å. Each grain is essentially single crystal in character, in particular an absence of twinning being noted, the grains being separated by very narrow inter-grain regions. This may be explained by the observation by the inventors that the pressure of the silane gas passing the heated substrates critically affects the first stages of nucleation, a decrease in pressure leading to nucleation becoming a rare event. This lack of nucleation thus leads to polysilicon films of larger grain size than is normally possible with conventional low pressure chemical vapour deposition techniques, the observed grain size increasing as the pressure is decreased, the grain tending to become columnar with increasing size. The inventors have also investigated the temperature dependence of this effect, finding that the pressure dependence of the grain size persists to temperatures as low as 580° C., although the grain size is reduced compared to films deposited at higher temperatures and equivalent silane gas pressures, it being necessary to reduce the pressure to achieve corresponding grain size to the films deposited at higher temperatures. Thus it is found that for substrate temperatures of 580° C., with silane pressures of 0.1 Pascal, grain sizes of 7500Å are achievable. It will be appreciated that in conventional low pressure chemical vapour techniques films deposited at such low substrate temperatures are amorphous. Such low substrate temperatures are, of course, very desirable for deposition processes using glass substrates.

It is found that thin film transistors fabricated using films deposited by a process in accordance with the invention have a much improved performance due to the larger grain size than films produced by known processes. Whilst the films produced by the process according to the invention have better electrical characteristics than previous films, they do have a rougher surface, but this can be compensated for by modifications in the device technology for the devices incorporation the films.

It will be appreciated that further improvements in the polysilicon deposited by a process in accordance with the invention may be obtained by use of even lower pressure within the deposition vessel for example down to 0.03 Pascal.

It will also be appreciated that by introducing an appropriate dopant gas, for example phosphine, diborine or arsine into the deposition vessel, doped polysilicon layers may be produced by a process in accordance with the invention, it being possible to produce p-n junctions by this means. Generally the dopant wil have a low flow rate compared to the silane gas, typically 0.1% of the silane gas flow.

It will also be appreciated that whilst $SiH_4$ is the silane gas used in the process described by way of example, other silane gases may in principle be used in a process in accordance with the invention.

We claim:

1. A process for depositing a polycrystalline silicon film on a substrate, comprising the steps of:
   (a) heating said substrate in a hot wall reactor to a temperature up to about 630° C;
   (b) passing silane gas at a deposition pressure up to about 1 Pascal over said substrate so that said heated substrate causes decomposition of said silane gas; and
   (c) maintaining the deposition pressure within a predetermined pressure range up to about 1 Pascal during passage of said silane gas;
   whereby a film of undoped polysilicon having a grain size of at least about 4000Å with substantially no twinning is deposited on said substrate.

2. A process according to claim 1, wherein said temperature is in a range from about 580° C. to about 630° C.

3. A process according to claim 1, wherein said pressure is in a range from about 0.03 Pascal to about 1 Pascal.

4. A process according to claim 1, wherein said steps are simultaneouly performed on a plurality of substrates.

5. A process according to claim 1, wherein said silane gas is $SiH_4$.

6. A process according to claim 1, wherein said substrate is a glass substrate.

7. A process for depositing a polycrystalline silicon film on a substrate, comprising the steps of:
   (a) heating said substrate to a temperature up to about 630° C.;
   (b) passing silane gas at a deposition pressure in a range from about 0.03 Pascal to about 1 Pascal over said substrate so that said heated substrate causes decomposition of said silane gas; and
   (c) maintaining the deposition pressure within said range during passage of said silane gas;
   whereby a film of undoped polysilicon having a grain size of at least about 4000Å with substantially no twinning is deposited on said substrate.

* * * * *